May 23, 1961 C. THEODORE ET AL 2,985,840

GAIN CONTROL AMPLIFIER

Filed Oct. 23, 1958 2 Sheets-Sheet 1

INVENTOR.
CHARLES THEODORE
WILLIAM W. CALDWELL
BY Harry R. Lubcke
AGENT

GAIN CONTROL AMPLIFIER

Filed Oct. 23, 1958 2 Sheets-Sheet 2

INVENTOR.
CHARLES THEODORE
WILLIAM W. CALDWELL
BY Harry R. Lubcke
AGENT

United States Patent Office 2,985,840

Patented May 23, 1961

2,985,840

GAIN CONTROL AMPLIFIER

Charles Theodore and William W. Caldwell, Los Angeles, Calif., assignors to Ling-Temco Electronics, Inc., Dallas, Tex., a corporation of Delaware Filed Oct. 23, 1958, Ser. No. 769,134

5 Claims. (Cl. 330—10)

Our invention relates to means for controlling the amplitude of a signal without introducing spurious components and particularly by modulation-amplification-demodulation means in which the amplitude of the signal is controlled in the absence of the carrier frequency.

The need for automatic gain control in an electronic system has been one of long standing. In low energy devices, such as ordinary radio receivers, the generation of spurious low frequency transients, or "thumps," may be overlooked. However, in high fidelity audio equipment, radio transmitters and particularly vibration testing apparatus, the reverse is true. In the latter apparatus such transients would frequently halt tests and large low frequency transients might damage the high power electro-mechanical transducer, or "shaker," because of excessive displacement of the armature thereof.

We have found that if we alter the gain of a gain control amplifier by controlling the amplitude of the sidebands in the absence of the carrier that produced them no transients are produced. Furthermore, a preferred embodiment of our device is a single-ended rather than push-pull. This does not require selection of balanced vacuum tubes or other components for proper operation. Also, direct coupling is not required in our amplifier in order to handle very low frequencies.

Our device may be briefly described as follows. A ring modulator receives the signal to be gain adjusted from an input transformer and also a carrier from a piezo crystal radio frequency oscillator. Only the two sidebands of the modulation process appear at the output of the ring modulator. A stage of radio frequency amplification follows, with double tuned input and output transformers. The gain of a pentode vacuum tube of the radio frequency amplifier stage is altered by the output of a triode impressed upon the cathode and/or suppressor of the pentode. This output is controlled by the controlling energy.

Two triodes form a product detector. Upon the grid of one the amplified radio frequency is impressed. Upon the grid of the other carrier frequency energy from the oscillator is impressed. The audio frequency component of the product thus formed constitutes the gain controlled signal, which may be subsequently amplified to increase the level and for isolation reasons.

An object of our invention is to provide a gain control amplifier devoid of spurious transients.

Another object is to produce a device of this class having single-ended rather than push-pull circuitry.

Another object is to provide such a device that does not require that vacuum tubes or other components have matched characteristics in pairs.

Another object is to provide a gain control amplifier capable of handling low alternating current frequencies without requiring direct coupling between the stages thereof.

Another object is to provide a gain control amplifier that is relatively inexpensive and contains few components.

Other objects will become apparent upon reading the following detailed specification and upon examining the accompanying drawings, in which are set forth by way of illustration and example certain embodiments of my invention.

Figure 1:
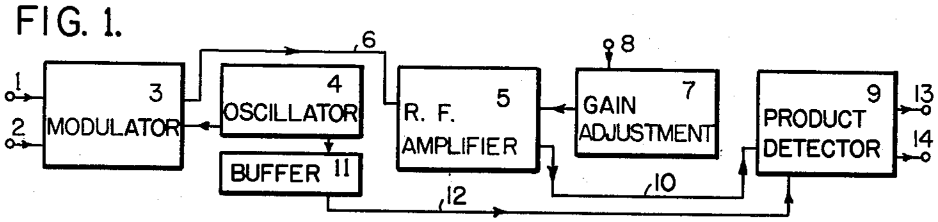
Fig. 1 is the block diagram of our grain control amplifier.

In Fig. 1 numerals 1 and 2 are the input terminals for the signal to be controlled, as, for instance, alternating electrical energy in the audio frequency range. This signal is impressed upon ring modulator 3, which is supplied in a balanced manner with carrier frequency electrical energy from oscillator 4. The upper and lower sidebands of the modulation process are conveyed from the output of the modulator to radio frequency amplifier 5 over conductor 6. A gain adjustment triode stage 7 connects to radio frequency amplifier 5 for the adjustment of the gain thereof. Electrical energy to control the gain is impressed at terminal 8. The amplified sidebands, of adjusted gain, are conveyed from radio frequency amplifier 5 to product detector 9 over conductor 10. For the demodulation process carrier electrical energy is also required in the product detector. Such energy is isolated from oscillator 4 by buffer amplifier stage 11 and conveyed to the product detector over conductor 12. The output terminals of our device are 13 and 14. These give the audio output from the product detector, with or without audio frequency amplification.

Figure 2:
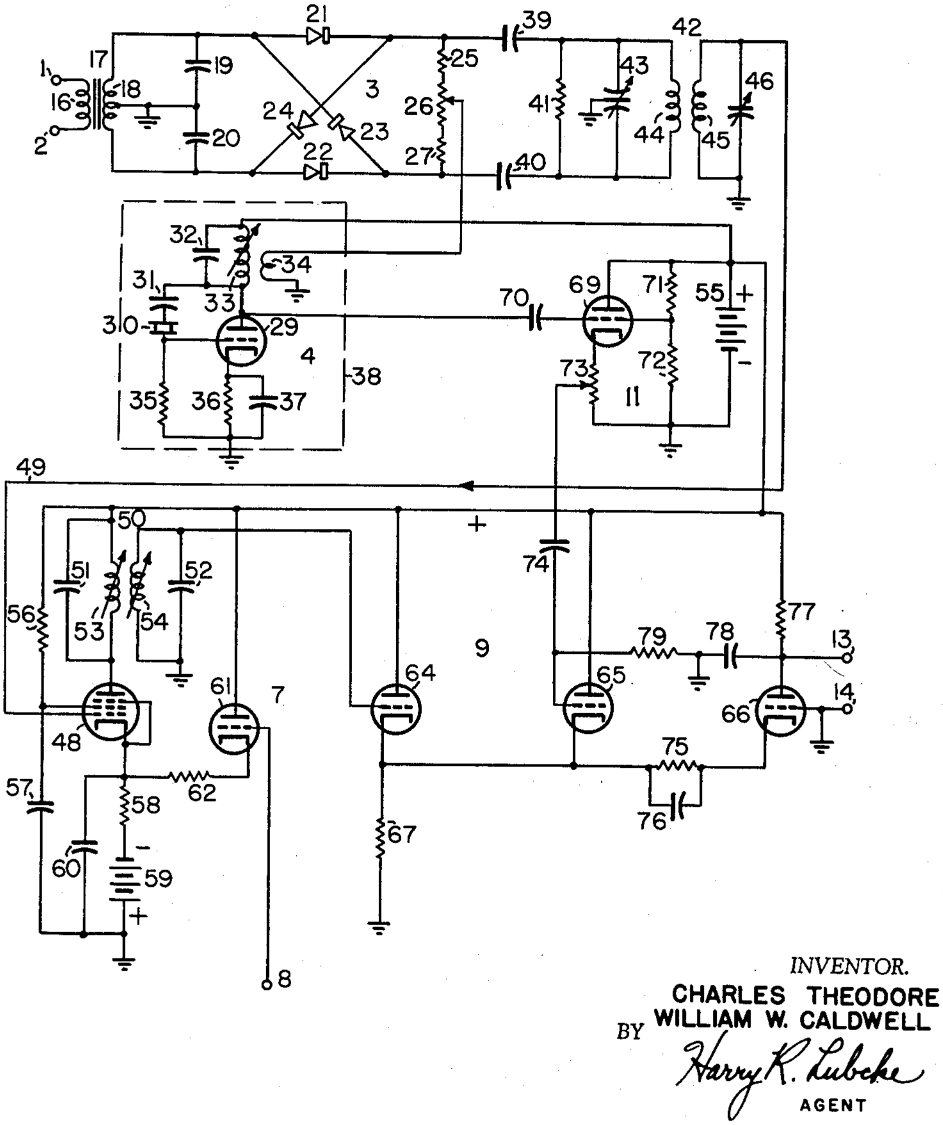
Fig. 2 is the schematic diagram of the same.

The circuit details are given in Fig. 2. Primary 16 of transformer 17 is connected to the input terminals for the signal to be controlled 1 and 2. This is a transformer of the usual audio frequency kind, having an impedance of the order of 600 ohms. It is employed to provide a push-pull output, which is accomplished by providing a grounded center-tap on secondary 18. Across the secondary are capacitors 19 and 20, of a thousandth microfarad capacitance each. These bypass radio frequency energy but not audio frequency energy.

Ring modulator 3 is comprised of matched individual germanium diodes 21, 22, 23, 24, or the equivalent, connected in the known ring modulator circuit. Such quads are commercially available as a unit. An important characteristic of this type of modulator is that only the upper and the lower sidebands appear at the output; i.e., across resistors 25, 26, 27. The carrier is absent. Each of resistors 25 and 27 have a resistance of the order of 500 ohms, while the centrally connected resistor 26 is a potentiometer of a hundred ohms resistance. The radio frequency carrier is introduced to the modulator at the adjustable contact of potentiometer 26 and this contact is adjusted to give symmetry to the modulator circuit so that the carrier will be balanced out at the outer terminals of resistors 25 and 27.

The oscillator, generally referenced as 4, is comprised of triode 29, having piezo crystal 30 connected between the grid and the plate of the triode in series with coupling capacitor 31. The crystal is cut for a radio frequency of, say, 1.5 megacycles. Any frequency from 100 kilocycles to several megacycles may be chosen for a practical embodiment. Capacitor 31 is only large enough to pass the radio frequency, as 100 micromicrofarads.

Capacitor 32 and variable inductor 33 comprise a parallel resonant circuit connected to the plate of triode 29. The inductor may be conveniently slug tuned with a powdered iron core arranged to be adjustably positioned within the same. Smaller inductor 34 is coupled by mutual inductance to inductor 33. One terminal of inductor 34 is grounded and the other is connected to the contact arm of potentiometer 26 for introducing the carrier, as has been mentioned.

In the oscillator, resistor 35 is the grid return resistor, having a resistance of the order of 100,000 ohms. Resistor 36 is the cathode bias resistor, being connected between the cathode of triode 29 and ground and having a resistance of 2,000 ohms. Capacitor 37 is a radio frequency bypass for resistor 36 and has a capacitance of a hundredth microfarad.

The double sideband output from the modulator is conveyed therefrom via equal capacitance capacitors 39, 40, each having a small capacitance of the order of 25 micromicrofarads. Shunting resistor 41 has a value of 100,000 ohms and connects across the tuned primary of double-tuned radio frequency transformer 42. The primary circuit includes variable capacitor 43 and fixed inductor 44.

The capacitor is preferably of the split stator type with the rotor grounded. This is to preserve the balanced relation of the modulator circuit. Capacitor 43 may have a capacitance range of from 15 to 45 micromicrofarads. Inductor 44 has the necessary inductance of a few hundred microhenries in order to resonate at 1.5 megacycles, or such other radio frequency as chosen. The secondary of radio frequency transformer 42 is composed of inductor 45 and variable capacitor 46. These components have the same values as recited for the primary components. The mutual inductance between the two inductors is such as to present a flat top to the band pass characteristic of the transformer over the frequency span of interest. This extends from the carrier frequency downward in frequency an amount equal to the audio range involved and also upward in frequency from the carrier a like amount. Thus, the pass band in various typical embodiments may be from 5 to 40 kilocycles in width, depending upon the range of vibration frequency or degree of audio fidelity desired.

One side of secondary inductor 45 is grounded and the other is connected to the control grid of pentode vacuum tube 48 by conductor 49. The plate of pentode 48 is connected to the primary of a radio frequency transformer 50, similar to that previously described. In the case of transformer 42 it was desirable that capacitors 43 and 46 be variable in order to attain accurate resonance with the frequency of oscillator 4. In transformer 50 fixed capacitors 51, 52 are employed, each having a capacitance of the order of 25 micromicrofarads. In this instance the inductors 53, 54 are variable, being slug tuned, and of a means inductance of a few hundred microhenries as before.

The low radio frequency potential end of inductor 53 is connected to a source of positive potential, such as a regulated power supply of a few hundred volts, or battery 55 as shown. The screen grid of pentode 48 is similarly connected through dropping resistor 56. Capacitor 57 is the known bypass for this circuit, with a capacitance of a hundredth microfarad. The suppressor grid of the pentode 48 is connected to the cathode thereof. The cathode is also connected to cathode resistor 58, which has a resistance of 20,000 ohms. The opposite end of this resistor is connected to a source of negative potential, such as battery 59, which may have a negative potential value of a few hundred volts. Capacitor 60 provides radio frequency pass to ground for resistor 58 and battery 59 and has a capacitance of a hundredth microfarad.

The electrical control energy for varying the gain of the original signal as desired is introduced at terminal 8 as a varying potential with respect to ground. Usually this is a slowly varying potential with relatively steady D.C. values at times. In vibration practice it may be derived from a transducer such as an accelerometer mounted upon the armature of the vibrator or shaker. The electrical output of the accelerometer is amplified, compared with a reference voltage, the result amplified, rectified and electrically integrated to obtain a varying D.C. corresponding to the envelope of the acceleration variations. This apparatus is not a part of this invention and so has not been illustrated. With such an input at terminal 8, however, our device will keep the envelope amplitude constant regardless of variations of response in the vibration system, such as variations in the transfer characteristic of the shaker.

In other applications, such as in radio broadcasting, a varying D.C. control energy corresponding to the amplitude of the audio frequency signal above a selected maximum is impressed at terminal 8. The polarity of the variation is arranged to reduce the gain of pentode 48 for large amplitudes, thus to prevent overload and hence distortion in a radio transmitter.

In Fig. 2 the control potential at 8 is directly connected to the grid of triode 61. The plate thereof is connected directly to the source of positive potential 55. The cathode of triode 61 is connected to the cathode of pentode 48 through resistor 62, which resistor has a resistance of several hundred ohms. The cathode current of triode 61 alters the cathode bias of pentode 48 and thus the gain thereof for the original signal. The large negative bias from source 59 insures that the mutual conductance of triode 61 shall not be appreciably altered by this bias change at the cathode of the pentode, hence that the amplification of the triode shall remain substantially constant for various control levels.

The product detector 9 of Fig. 1 is comprised primarily of triodes 64, 65 in Fig. 2. The grid of triode 64 connects directly to the secondary 52, 54 of radio frequency transformer 50. The plate of the triode connects directly to the positive voltage source 55. The cathode connects directly to a common cathode resistor 67, the other end of which is grounded. This resistor has a resistance of the order of a thousand ohms. Triode 64 serves to introduce the sidebands into the product detector.

Triode 65 serves to introduce the carrier to the product detector, the product of the carrier and the sidebands giving an audio frequency output.

The carrier is obtained from buffer amplifier 11. This has cathode-follower triode 69, the grid of which is connected to the plate of oscillator triode 29 through capacitor 70. The latter has a capacitance of the order of a hundredth microfarad. The grid of triode 69 is held at a positive potential in order to obtain a desired large voltage output from the cathode. The positive potential on the grid is of the order of one-third that of the plate. The plate of the triode is connected directly to positive voltage source 55. Resistors 71 and 72 form a voltage divider for the grid. The former is connected directly to the battery and has a resistance of the order of 200,000 ohms while resistor 72 is connected at its remote extremity to ground and has a resistance of 100,000 ohms. A potentiometer 73 connects from cathode to ground to act as cathode resistor for triode 69 and to provide a variable output voltage for the product detector. The variable contact arm of the potentiometer connects to the grid of triode 65 through capacitor 74. The capacitance thereof is a thousandth microfarad. The capacitor removes the D.C. potential that exists at potentiometer 73. Grid return resistor 79 is connected to the grid of triode 65 and to ground, thereby to establish the potential of the grid for unvarying currents as ground. The resistance of resistor 79 is of the order of a megohm.

In the common cathode resistor 67 both carrier and sidebands are electrically multiplied. This results in a heterodyning of the components in which a frequency approximately double that of the carrier is produced and also the audio frequency. The detector circuit is arranged to be unresponsive to the double frequency and so the audio frequency is available.

Triode 66 is an output amplifier. The detected audio signal is fed to it from the cathodes of triodes 64 and 65. Resistor 75 and shunt capacitor 76 connecting therefrom to the cathode of triode 66 is an additional cathode bias arrangement. The resistance of the resistor is 2,000 ohms and the capacitance of the capacitor five-thousandths of a microfarad in a typical embodiment. The plate of triode 66 is connected to positive voltage source 55 though plate output resistor 77, which has a resistance of the order of a hundred thousand ohms. Capacitor 78 is a radio frequency bypass capacitor and is connected from that plate to ground. It has a capacitance of the order of 500 micromicrofarads. The high output terminal 13 is also connected to the plate of triode 66. The grid of the triode is grounded and also forms the connection for low output terminal 14.

In recapitulation, the product detector recreates the original audio frequency as gain controlled by the voltage impressed at terminal 8.

Certain alternate embodiments of our device are possible.

Figure 3:
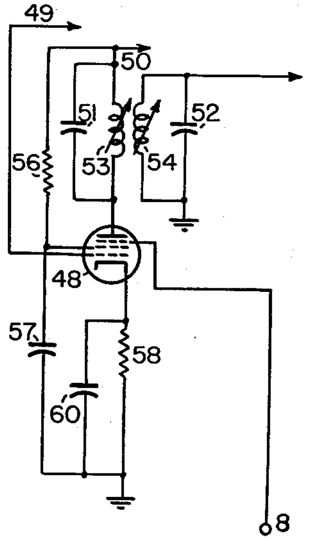
Fig. 3 is a fragmentary schematic diagram of a modification of Fig. 2.

Rather than employing control triode 61, control of the gain of amplifier pentode 48 can be obtained by impressing the voltage from terminal 8 directly upon the suppressor (third from cathode) grid, as shown in Fig. 3. This grid and the cathode of the tube are not then connected. The isolation provided from any external circuit connected to terminal 8 is then lacking because of the elimination of triode 61, but simplification is achieved in that triode 61 and battery 59 are not required.

Triode 66 may also be eliminated where output impedance aspects concerned with the load to be attached do not affect the operation of the product detector and where a reduced signal amplitude suffices.

Figure 4:
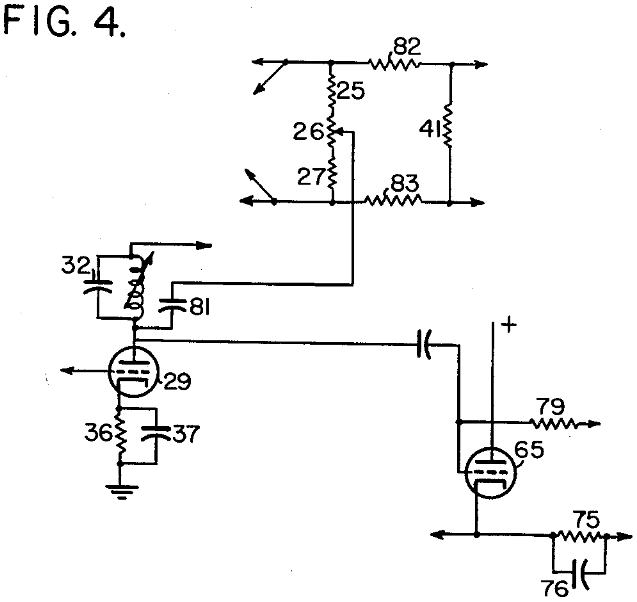
Fig. 4 is a fragmentary schematic diagram of a further modification of Fig. 2.

As shown in Fig. 4, capacitative coupling by means of capacitor 81 between oscillator 4 and potentiometer arm 26 may be employed, in which case capacitors 39 and 40 may be replaced by resistors 82, 83 of a few thousand ohms resistance. In this modification the carrier may be reinserted directly to the product detector through capacitor 70 to the grid of triode 65. This eliminates triode 69. These modifications result in simplification but ease of adjustment and overall performance are less favorable than the circuits given.

A shield 38 around oscillator 4 is desirable.

Vacuum diodes may be employed in modulator 3, and an oscillator of different circuit details than that of 4 may be used.

Twin triodes may be employed and for particular reasons not inherent in our device pentodes may be employed instead of triodes.

More than one radio frequency amplifier tube may be employed and the transformers therefor may be stagger tuned rather than the double tuned preferred arrangement shown.

While audio frequencies and sub-audible frequencies have been mentioned as signals of prime interest, the signals may extend far into the super-audible frequency range by suitably broadening the response of the radio frequency transformers, reducing the capacitance of the radio frequency bypass capacitors, and making other modifications in accordance with higher frequency technique.

Other modifications in the characteristics of the circuit elements, details of circuit connections and alteration of the coactive relation between elements may be taken without departing from the scope of our invention.

Having thus fully described our invention and the manner in which it is to be practiced, we claim:

1. A gain control system comprising a ring modulator, a carrier-frequency oscillator, means to impress a signal to be gain-controlled upon said modulator, a low impedance inductive link to connect said oscillator to said modulator for producing double sideband modulation of said signal, first coupling means having two inductively-coupled parallel-resonant circuits, a single multigrid vacuum tube radio frequency amplifier having a cathode and a grid, said cathode negatively biased with respect to the potential of said grid, said first coupling means connected between said modulator and said grid, means connected to said multigrid vacuum tube to alter the gain of said radio frequency amplifier, a single-ended product detector having two vacuum tubes each having an input electrode and a cathode, a single cathode resistor, the cathodes of said two vacuum tubes connected together and to said cathode resistor, said second coupling means having two inductively-coupled parallel-resonant circuits connected between said multigrid vacuum tube and the input electrode of the first of said two tubes of said product detector, means to connect the input electrode of the second of said two tubes to said oscillator, and an output tube having a cathode and a plate, the cathode of said output tube connected to the connected-together cathodes of said two vacuum tubes, a plate impedance, the plate of said output tube connected to said plate impedance and constituting an outer terminal of said system.

2. A gain control amplifier system comprising a ring modulator, a carrier-frequency oscillator, means to impress a signal to be gain-controlled upon said modulator, low impedance inductive means to connect said oscillator to said modulator for producing two sideband modulation of said signal, first coupling means having two inductively-coupled parallel-resonant circuits, a single multielectrode vacuum tube radio frequency amplifier having a cathode and an input electrode, said cathode highly negatively biased with respect to the potential of said input electrode, said first coupling means connected between said modulator and said input electrode of said multielectrode vacuum tube, a gain control triode, the cathode of said gain control triode connected to the cathode of said multielectrode vacuum tube through a current-limiting resistor, a single-ended product detector having two vacuum tubes each having an input electrode and a cathode, a single cathode resistor, the cathodes of said two vacuum tubes connected together and to said cathode resistor, second coupling means having two inductively-coupled parallel-resonant circuits connected between said multielectrode vacuum tube and the input electrode of the first of said two tubes of said product detector, the input electrode of the second of said two tubes connected to said oscillator, and an output triode, bias means for said output triode, the cathode of said output triode connected through said bias means to the connected-together cathodes of said product detector, a plate impedance, the plate of said output triode connected to said plate impedance and constituting an output terminal of said system.

3. A gain control amplifier system comprising a ring modulator, a carrier-frequency oscillator, means to impress a signal to be gain-controlled upon said modulator, a low impedance inductive link, said oscillator connected to said modulator through said inductive link, said modulator constituted to produce double sideband amplitude modulation of said signal, first inductive means having two inductively coupled parallel resonant circuits, said first inductive means connected to said modulator to pass said double sidebands, a single pentode vacuum tube radio frequency amplifier having a cathode, an input electrode and a suppressor grid, said suppressor grid connected to a source of gain control signal, the input electrode of said pentode connected to said first inductive means, a single-ended product detector having two vacuum tubes each with an input electrode and a cathode, only one cathode resistor, the cathodes of said two vacuum tubes connected together and to said cathode resistor, second inductive means having two parallel resonant circuits connected between said pentode and the input electrode of the first of said two tubes of said product detector, a cathode-follower vacuum tube having a cathode resistor with an adjustable tap, means to connect the input of said cathode-follower vacuum tube to said oscillator, said adjustable tap connected to the input electrode of the second of said two tubes of said product detector, and an output triode, bias means for said output triode, the cathode of said output triode connected through said bias means to the connected-together cathodes of said product detector, a plate impedance, the plate of said output triode connected to said plate impedance and constituting an output terminal of said system.

4. A gain control system comprising a ring modulator, a carrier frequency oscillator, inductive input means, a source of signal to be gain-controlled, low impedance inductive means, said oscillator connected to said modulator through said inductive means, said inductive input means connected to said source and connected to said modulator oppositely to said oscillator to produce double sideband modulation of said signal, a first transformer having two parallel resonant circuits, said first transformer connected to said modulator opposite to said inductive input means to pass only said double sidebands, a single multigrid vacuum tube radio frequency amplifier having a cathode and an input electrode, said cathode highly negatively biased with respect to the potential of said input electrode, said input electrode connected to said first transformer, a gain control tube having a cathode, the cathode of said gain control tube connected to the cathode of said multigrid vacuum tube through a current-limiting resistor, a single-ended product detector having two triodes, a cathode resistor, the cathodes of said two triodes connected together and to said cathode resistor, a second transformer having two parallel resonant circuits connected between said multigrid vacuum tube and the first of said two triodes of said product detector, a cathode-follower vacuum tube having a cathode resistor with an adjustable tap and also having an input electrode connected to said oscillator, said adjustable tap connected to the second of said two triodes of said product detector, an output triode, bias means for said output triode, the cathode of said output triode connected through said bias means to said one cathode resistor, and a plate resistor, the plate of said output triode connected to said plate resistor and constituting an output terminal of said system.

5. A transientless gain control amplifier system comprising a ring modulator, a crystal-controlled carrier-frequency oscillator, an input transformer, a source of signal to be gain-controlled, a low impedance inductive link, said oscillator connected to the output and the input of said modulator through said inductive link, said input transformer connected to said source and connected to the input of said modulator oppositely to said oscillator to produce double sideband amplitude modulation of said signal upon said carrier, a first double-tuned transformer having two parallel type resonant circuits, said first double-tuned transformer connected to said modulator opposite to said input transformer to pass only said double side bands, a single multigrid vacuum tube radio frequency amplifier having a cathode and an input grid, said cathode highly negatively biased with respect to the potential of said input grid, said input grid connected to said first double-tuned transformer, a gain control triode, the cathode of said gain control triode connected to the cathode of said multigrid vacuum tube through a current-limiting resistor, a single-ended product detector having two triodes and one cathode resistor, the cathodes of said two triodes connected together and to said one cathode resistor, a second double-tuned transformer connected between said multigrid vacuum tube and the grid of the first of said two triodes of said product detector, a cathode-follower vacuum tube having a cathode resistor with an adjustable tap, means to positively bias the control grid of said cathode-follower vacuum tube and to connect said control grid to said oscillator, said adjustable tap connected to the grid of the second of said two triodes of said product detector, an output triode, resistive-capacitative bias means for said output triode, the cathode of said output triode connected through said bias means to said one cathode resistor, the grid of said output triode connected to ground, and a plate resistor, the plate of said output triode connected to said plate resistor and to an output terminal of said system.

References Cited in the file of this patent

UNITED STATES PATENTS

| | | |
|---|---|---|
| 1,550,660 | Affel | Aug. 25, 1925 |
| 1,999,656 | Goodard | Apr. 30, 1935 |
| 2,115,377 | Weyers | Apr. 26, 1938 |
| 2,211,010 | Hallmark | Aug. 13, 1940 |
| 2,286,106 | Ritzmann | June 9, 1942 |
| 2,379,484 | Haynes | July 3, 1945 |
| 2,487,212 | Bell | Nov. 8, 1949 |
| 2,512,994 | Benner | June 27, 1950 |
| 2,547,903 | Du Bois | Apr. 3, 1951 |
| 2,611,036 | Norgaard | Sept. 16, 1952 |
| 2,711,531 | Murdock | June 21, 1955 |
| 2,721,909 | Davies | Oct. 25, 1955 |
| 2,757,284 | Hutchinson et al. | July 31, 1956 |
| 2,804,596 | Hawks | Aug. 27, 1957 |
| 2,813,975 | Gabor | Nov. 19, 1957 |
| 2,856,587 | Batchelor | Oct. 14, 1958 |
| 2,859,288 | Tobias et al. | Nov. 4, 1958 |
| 2,940,056 | Norgaard | June 7, 1960 |

OTHER REFERENCES

Terman: Electronic and Radio Engineering, Fourth edition, published by McGraw-Hill Book Co., Inc., N.Y. in 1955, pages 516–517.